(12) United States Patent
Chan

(10) Patent No.: US 8,810,012 B2
(45) Date of Patent: Aug. 19, 2014

(54) CHIP PACKAGE, METHOD FOR FORMING THE SAME, AND PACKAGE WAFER

(71) Applicant: Xintec Inc., Jhongli (TW)

(72) Inventor: Yuan-Ru Chan, Taoyuan (TW)

(*) Notice: Subject to any disclaimer, the term of this patent is extended or adjusted under 35 U.S.C. 154(b) by 0 days.

(21) Appl. No.: 13/678,503

(22) Filed: Nov. 15, 2012

(65) Prior Publication Data
US 2013/0119524 A1  May 16, 2013

Related U.S. Application Data

(60) Provisional application No. 61/559,873, filed on Nov. 15, 2011, provisional application No. 61/593,020, filed on Jan. 31, 2012.

(51) Int. Cl.
*H01L 23/495* (2006.01)

(52) U.S. Cl.
USPC .......................................... 257/668

(58) Field of Classification Search
CPC .............. H01L 23/481; H01L 21/7689; H01L 23/49827; H01L 21/486; H01L 21/76802; H01L 21/76877; H01L 21/76879; H01L 23/5226; H01L 24/26; H01L 24/81; H01L 24/85; H05K 7/02
USPC ................................ 257/678–733, 787–796, 257/E23.001–E23.194, E23.181, E21.502, 257/E21.499–E21.519, E21.627, 257/E21.575–E21.597, E21.641
See application file for complete search history.

(56) References Cited

U.S. PATENT DOCUMENTS

| | | | | |
|---|---|---|---|---|
| 8,273,656 | B2 * | 9/2012 | Sakaki .......................... | 438/652 |
| 2004/0090758 | A1 * | 5/2004 | Horikawa ...................... | 361/782 |
| 2005/0253248 | A1 * | 11/2005 | Shimizu et al. ............... | 257/700 |
| 2005/0263867 | A1 * | 12/2005 | Kambe et al. .................. | 257/678 |
| 2005/0269685 | A1 * | 12/2005 | Chung et al. .................. | 257/698 |
| 2006/0192282 | A1 * | 8/2006 | Suwa et al. .................... | 257/723 |
| 2012/0115323 | A1 * | 5/2012 | Muragishi et al. ............ | 438/652 |
| 2013/0075896 | A1 * | 3/2013 | Yoda et al. ..................... | 257/737 |
| 2013/0105968 | A1 * | 5/2013 | Lu et al. ......................... | 257/737 |

* cited by examiner

*Primary Examiner* — Dao H Nguyen
*Assistant Examiner* — Tram H Nguyen
(74) *Attorney, Agent, or Firm* — Liu & Liu

(57) ABSTRACT

A chip package includes: a substrate having a first surface and a second surface; a device region disposed in or on the substrate; a conducting pad disposed in the substrate or on the first surface, wherein the conducting pad is electrically connected to the device region; a hole extending from the second surface towards the first surface of the substrate; a wiring layer disposed on the second surface of the substrate and extending towards the first surface of the substrate along a sidewall of the hole to make electrical contact with the conducting pad, wherein a thickness of a first portion of the wiring layer located directly on the conducting pad is smaller than a thickness of the second portion of the wiring layer located directly on the sidewall of the hole; and an insulating layer disposed between the substrate and the wiring layer.

24 Claims, 17 Drawing Sheets

CHIP PACKAGE, METHOD FOR FORMING THE SAME, AND PACKAGE WAFER

CROSS REFERENCE TO RELATED APPLICATIONS

This Application claims the benefit of U.S. Provisional Application No. 61/559,873, filed on Nov. 15, 2011, the entirety of which is incorporated by reference herein. This Application claims the benefit of U.S. Provisional Application No. 61/593,020, filed on Jan. 31, 2012, the entirety of which is incorporated by reference herein.

BACKGROUND OF THE INVENTION

1. Field of the Invention

The invention relates to a chip package, and in particular to a chip package formed by a wafer-level packaging process.

2. Description of the Related Art

A packaging process of chip packages is one important step in forming electronic products. A chip package not only provides protection for the chips from environmental contaminants, but also provides a connection interface for internal electronic elements of chips packaged therein.

Because the size of the chip shrinks and the number of pads increases, it is more difficult to form wires electrically connected to the pads in the chip package. Thus, an improved chip packaging technique is needed.

BRIEF SUMMARY OF THE INVENTION

An embodiment of the present invention provides a chip package which includes: a substrate having a first surface and a second surface; a device region disposed in or on the substrate; a conducting pad disposed in the substrate or on the first surface, wherein the conducting pad is electrically connected to the device region; a hole extending from the second surface towards the first surface of the substrate; a wiring layer disposed on the second surface of the substrate and extending towards the first surface of the substrate along a sidewall of the hole to make electrical contact with the conducting pad, wherein a thickness of a first portion of the wiring layer located directly on the conducting pad is smaller than a thickness of the second portion of the wiring layer located directly on the sidewall of the hole; and an insulating layer disposed between the substrate and the wiring layer.

An embodiment of the present invention provides a method for forming a chip package which includes: providing a substrate having a first surface and a second surface, wherein a device region and a conducting pad are formed in the substrate or disposed on the substrate, and the conducting pad is electrically connected to the device region; removing a portion of the substrate from the second surface of the substrate to form at least one hole extending towards the first surface, wherein the hole overlaps a portion of the conducting pad; conformally forming an insulating layer on the second surface of the substrate, wherein the insulating layer extends to a bottom of the hole to cover the conducting pad; forming a first conducting layer on the insulating layer; removing a portion of the first conducting layer to expose the insulating layer on the bottom of the hole; using the first conducting layer as a mask and etching the exposed insulating layer to expose the conducting pad; forming a second conducting layer on the second surface of the substrate, wherein the second conducting layer extends into the hole to make electrical contact with the conducting pad; patterning the first conducting layer and the second conducting layer; and forming a third conducting layer on the patterned second conducting layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings.

DETAILED DESCRIPTION OF THE INVENTION

Figure 1A:
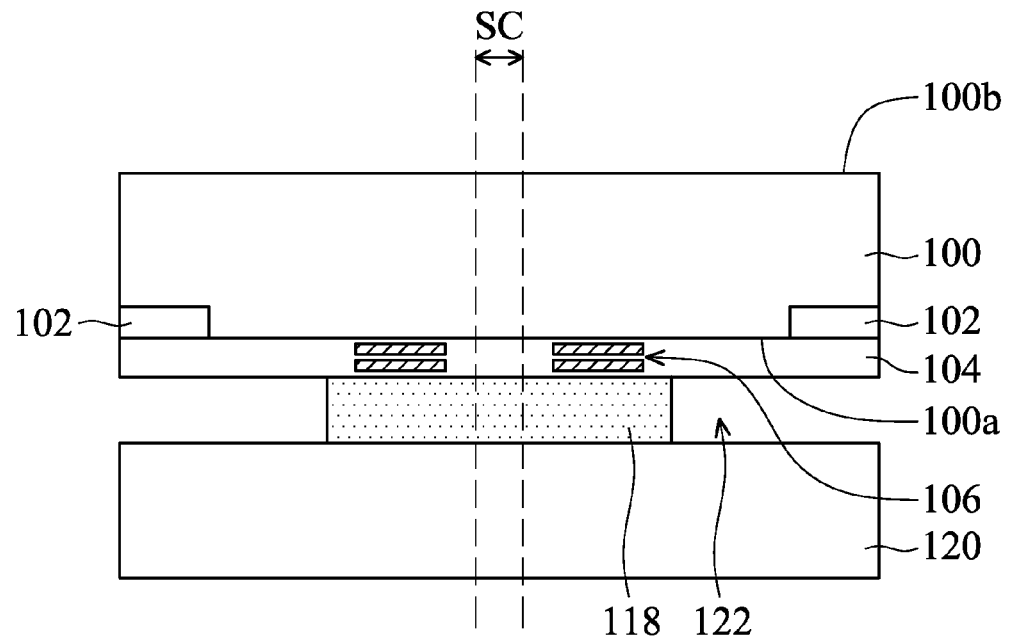
FIGS. 1A-1H are cross-sectional views showing the steps for forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to the package active or passive devices, or electronic components with digital or analog circuits, such as optoelectronic devices, microelectromechanical systems (MEMS), microfluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, microactuators, surface acoustic wave devices, pressure sensors, ink printer heads, or power IC modules.

The wafer-scale packaging process mentioned above mainly means that after the packaging process is accomplished during the wafer stage, the wafer with chips is cut to obtain separate independent packages. However, in a specific embodiment, separate independent chips may be redistributed overlying a supporting wafer and then be packaged, which may also be referred to as a wafer-scale packaging process. In addition, the above mentioned wafer-scale packaging process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

FIGS. 1A-1H are cross-sectional views showing the steps for forming a chip package according to an embodiment of the present invention. In one embodiment, the process steps of a chip package include a front-end chip (wafer) process step and a back-end packaging process step. Through front-end semiconductor processes such as deposition, etching, and development, a variety of integrated circuits may be formed on a wafer. Then, a back-end wafer-level packaging process may be performed to the wafer having integrated circuits formed thereon, followed by a dicing process step to form a plurality of separate chip scale packages.

As shown in FIG. 1A, in the front-end chip process step, a substrate 100 is first provided, which includes a surface 100a and a surface 100b. The substrate 100 is, for example, a semiconductor substrate. In one embodiment, the substrate 100 may be a semiconductor wafer such as a silicon wafer. The substrate 100 may be divided into a plurality of die regions defined by a plurality of predetermined scribe lines SC.

A plurality of device regions 102 may be formed and/or disposed in and/or on the substrate 100. In one embodiment, each of the die regions of the substrate 100 defined by the predetermined scribe lines SC may have at least one device region 102 and a plurality of peripheral regions that correspondingly surround the device regions 102. The device region 102 may include a variety of active or passive devices, or electronic components with digital or analog circuits, such as optoelectronic devices, microelectromechanical systems (MEMS), microfluidic systems, and physical sensors for detecting heat, light, or pressure, or power MOSFET modules. In the embodiment shown in FIG. 1, the device region 102 may include an optoelectronic device such as an image sensor device or a light-emitting device.

As shown in FIG. 1A, at least a dielectric layer 104 may be formed on the surface 100a of the substrate 100 for the use of insulating and covering. A plurality of conducting pads 106 may be formed between the dielectric layer 104 and the substrate 100. The conducting pads 106 may be disposed on, for example, peripheral regions of the substrate 100 and be arranged along positions near the predetermined scribe lines SC. The conducting pad 106 may be electrically connected to elements in the device region 102 through an interconnection structure (not shown). In one embodiment, each of the conducting pads 106 may include a stacked structure consisting of a plurality of conducting layers formed in the dielectric layer 104. The stacked conducting layers may be electrically connected to each other through, for example, a metal interconnection structure (not shown).

After the front-end chip process step is accomplished, a back-end packaging process step may then be performed to the wafer with the integrated circuits formed therein. As shown in FIG. 1A, a cover plate 120 may optionally be disposed on the surface 100a of the substrate 100. The cover plate 120 may be a substrate such as a glass substrate, quartz substrate, transparent polymer substrate, or combinations thereof. In one embodiment, a spacer layer 118 may be disposed between the cover plate 120 and the substrate 100. The spacer layer 118 may be optionally disposed to partially or completely cover the conducting pad 106 and may further extend across over the predetermined scribe line SC. The material of the spacer layer 118 may, for example, be a photosensitive polymer material and may be defined and formed through an exposure process and a development process. The spacer layer 118, the cover plate 120, and the substrate 100 may define a substantially closed cavity 122 on the device region 102. The cavity 122 may, for example, be used to contain the microlenses, filter plate structures, or other optical structures.

In one embodiment, the spacer layer 118 may first be formed on the cover plate 120, followed by being bonded onto the dielectric layer 104 on the substrate 100. In one embodiment, the spacer layer 118 still has stickiness after the exposure and development processes are performed and so may be directly bonded on the substrate 100. In one embodiment, after the spacer layer 118 is bonded to the substrate 100, a curing process may be performed to the spacer layer 118. For example, the spacer layer 118 may be heated. Alternatively, the spacer layer 118 may be bonded onto the substrate 100 through an adhesive (not shown). In another embodiment, the spacer layer 118 may also be first formed on the substrate 100, and the spacer layer 118 and the cover plate 120 are then bonded.

Then, the substrate 100 may be optionally thinned. For example, the cover plate 120 may be used as a support substrate, and a thinning process (such as a mechanical grinding process or a chemical mechanical polishing process) may be performed to the surface 100b of the substrate 100 to thin down the substrate 100 to an appropriate thickness.

Figure 1B:
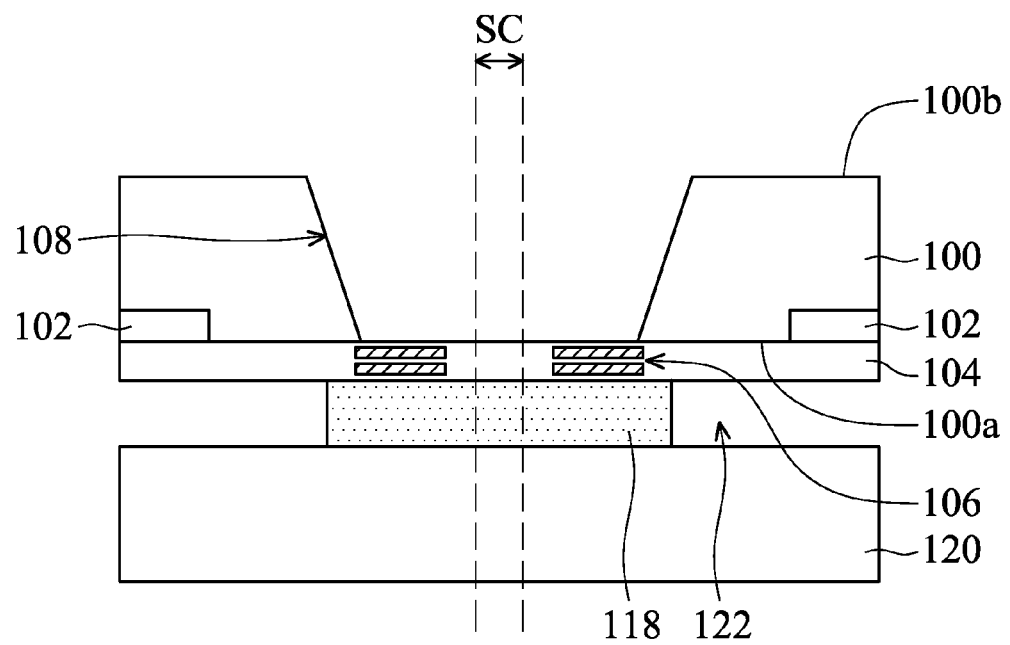

Next, as shown in FIG. 1B, through a photolithography process and an etching process, a portion of the substrate 100 may be removed from the surface 100b of the substrate 100 to form a plurality of holes 108 extending towards the surface 100a. In one embodiment, the holes 108 may include trenches which may be substantially parallel to the predetermined scribe lines.

Figure 1C:
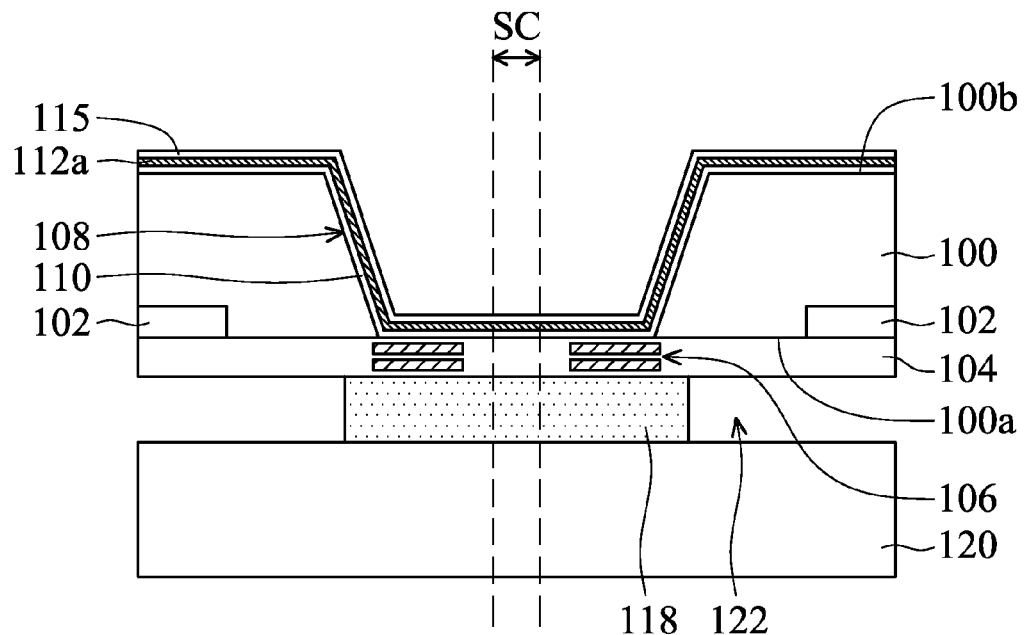

As shown in FIG. 1C, an insulating layer 110 may be formed on the surface 100b of the substrate 100. In one embodiment, the insulating layer 110 may be conformally formed on the surface 100b and extend towards a bottom of the hole 108 along the sidewall of the hole 108 to cover the dielectric layer 104 and the conducting pads 106 thereunder. In one embodiment, the insulating layer 110 may include silicon oxide, silicon nitride, silicon oxynitride, or combinations thereof. For example, the insulating layer 110 may be formed by using a chemical vapor deposition process or another suitable process. Because the size of the chip package continues to shrink, the aspect ratio of the hole 108 increases accordingly. The use of a chemical vapor deposition process to form the insulating layer 110 may facilitate the proceeding of subsequent processes.

Then, a conducting layer 112a may be formed on the insulating layer 110. The conducting layer 112a may include aluminum, copper, an alloy of aluminum and copper, or combinations thereof. The formation method for the conducting layer 112a may include a physical vapor deposition process, chemical vapor deposition process, applying process, or combinations thereof. In one embodiment, the conducting layer 112a is formed on the insulating layer 110 by using a sputtering process. In one embodiment, the conducting layer 112a substantially and/or completely covers the insulating layer 110.

Then, the conducting layer 112a is patterned such that the insulating layer 110 directly on the bottom of the hole 108 is exposed. In one embodiment, a photoresist layer 115 may first be formed on the conducting layer 112a, as shown in FIG. 1C. The photoresist layer 115 may substantially and/or completely cover the conducting layer 112a. In one embodiment, the photoresist layer 115 may be an electroplated photoresist which may be deposited on a surface of the conducting layer 112a by using an electroplating process to conformally, substantially, and/or completely cover the conducting layer 112a.

Figure 1D:
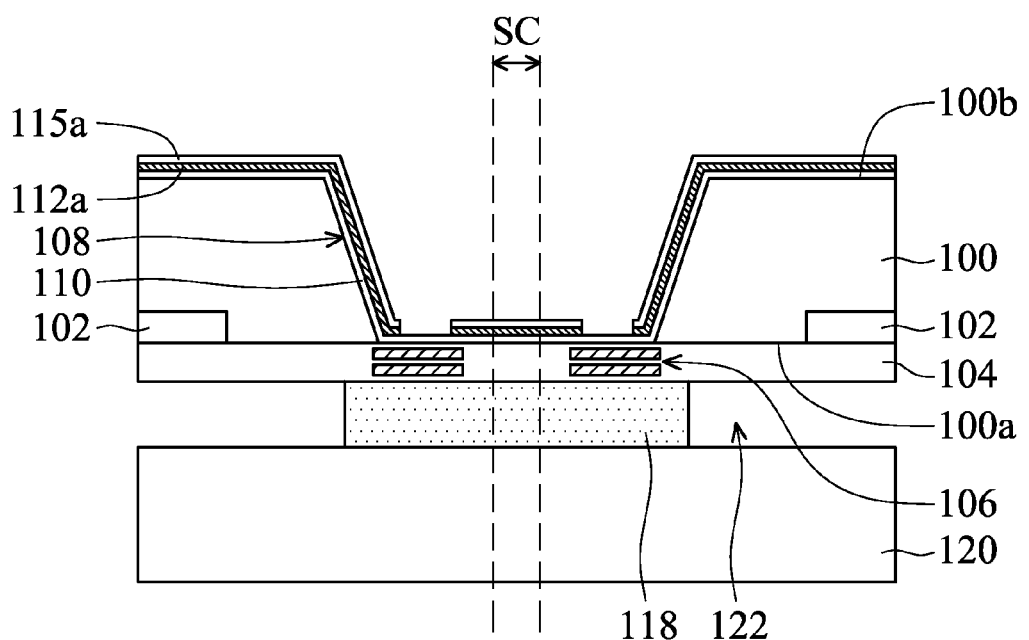

Next, as shown in FIG. 1D, the photoresist layer 115 may be patterned through an exposure process and a development process to form a patterned photoresist layer 115a. The patterned photoresist layer 115a has openings exposing the conducting layer 112a. In addition, the openings of the patterned photoresist layer 115a may align with the conducting pads 106 thereunder. Then, the patterned photoresist layer 115a may be used as a mask, and the exposed conducting layer 112a is etched to expose the insulating layer 110 on the bottoms of the holes 108.

Figure 1E:
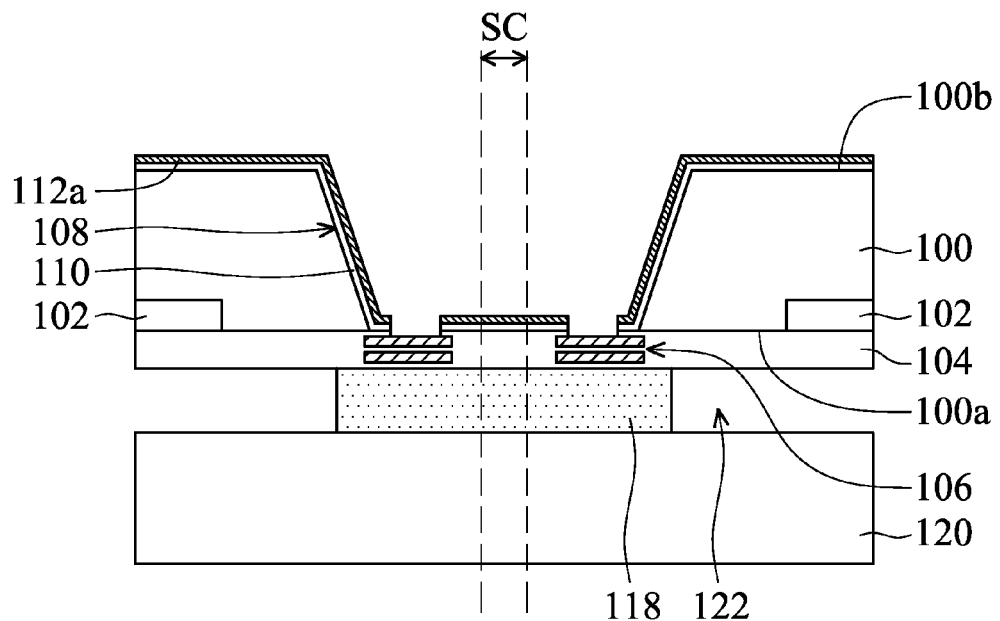

Next, as shown in FIG. 1E, the patterned photoresist layer 115a is removed. The conducting layer 112a may be used as mask, and the exposed insulating layer 110 and the dielectric layer 104 thereunder are etched to expose the conducting pads 106. In one embodiment, the etchant used for etching the insulating layer 110 may not substantially and/or completely etch the conducting layer 112a.

Figure 1F:
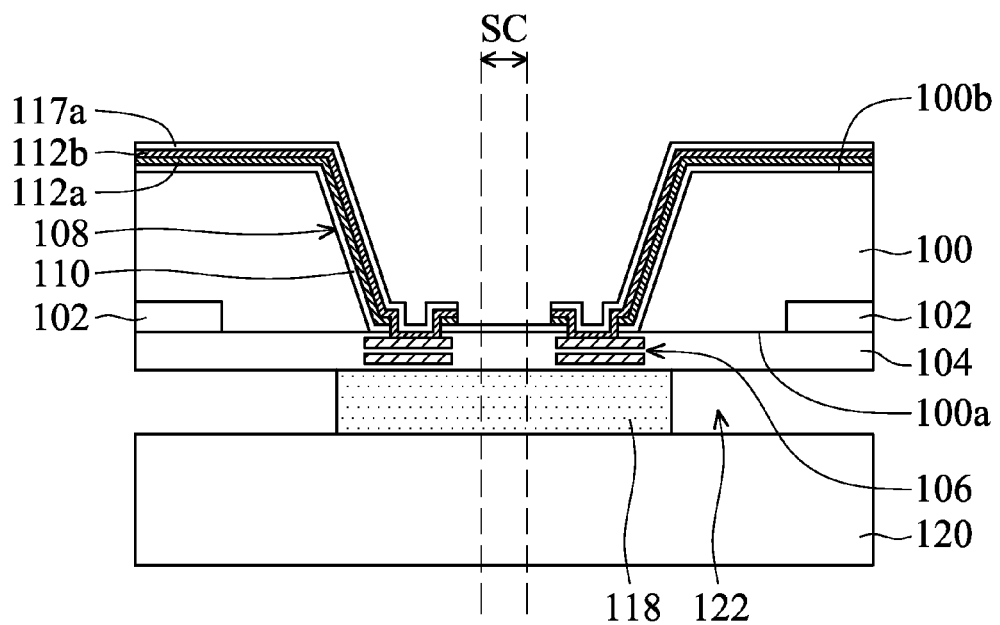

Next, as shown in FIG. 1F, a conducting layer 112b may be conformally formed on the surface 100b of the substrate 100. The conducting layer 112b may extend into the hole 108 to make electrical contact with the exposed conducting pad 106. The material and the formation method of the conducting layer 112b may be similar to those of the conducting layer 112a. Then, the conducting layer 112b and the conducting layer 112a may be patterned to form the desired conducting patterns according to the requirements.

In one embodiment, a patterned photoresist layer 117a may be formed on the conducting layer 112b, which has openings exposing the conducting layer 112b. Then, the patterned photoresist layer 117a may be used as a mask, and the exposed conducting layer 112b and a portion of the conducting layer 112b thereunder are etched to pattern the conducting layer 112b and the conducting layer 112a into a desired conducting pattern according to the requirements, as shown in FIG. 1F.

Figure 1G:
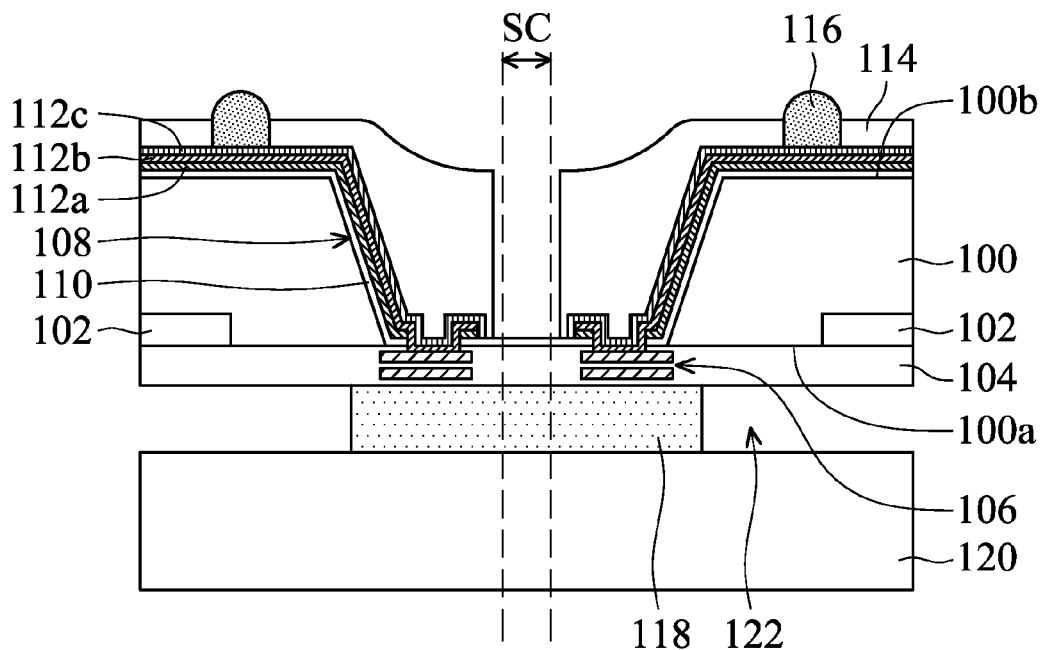

Next, as shown in FIG. 1G, the patterned photoresist layer 117a may be removed. In one embodiment, a conducting layer 112c may be optionally formed on the conducting layer 112b and the conducting layer 112a. In one embodiment, a conducting material may be deposited on the patterned conducting layer 112b and the patterned conducting layer 112a by using an electroplating process or an electroless plating process to form the conducting layer 112c. The conducting layer 112c has a conducting pattern substantially the same as that of the conducting layer 112b. The conducting layer 112a, the conducting layer 112b, and the conducting layer 112c may together serve as a wiring layer electrically connected to the device region 102. In one embodiment, the conducting layer 112c covers a side terminal of the conducting layer 112a and a side terminal of the conducting layer 112b. In one embodiment, the side terminal of the conducting layer 112a is substantially coplanar with the side terminal of the conducting layer 112b. In one embodiment, the material of the conducting layer 112c is different from that of the conducting layer 112a or the conducting layer 112b. The thickness of the conducting layer 112c may, for example, be greater than that of the conducting layer 112a or the conducting layer 112b.

Next, a patterned protection layer 114 may optionally be formed on the surface 100b of the substrate 100 and the wiring layer, which has openings exposing the wiring layer. Then, conducting bumps 116 may be formed in the openings of the protection layer 114. The conducting bump 116 is electrically connected to the device region 102 through the wiring layer and the conducting pad 106. In one embodiment, the protection layer 114 may not cover the predetermined scribe lines SC to prevent further damage to the package caused by a subsequent dicing process.

Figure 1H:
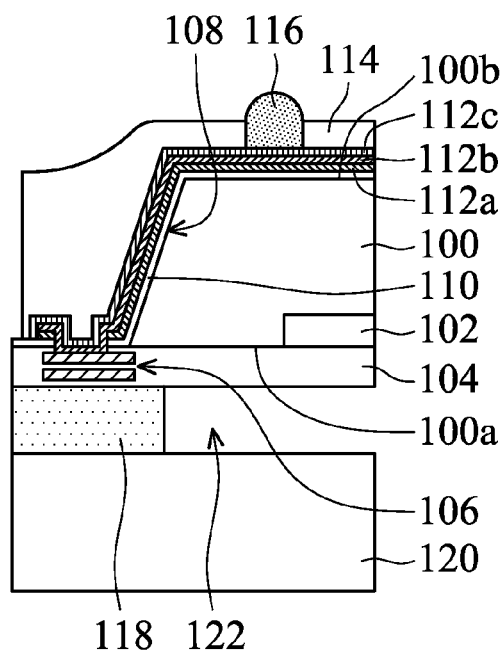

Next, as shown in FIG. 1H, a dicing process is performed along the predetermined scribe lines SC of the substrate 100 to form at least one chip package. In one embodiment, the thickness of the portion of the wiring layer directly on the conducting pad 106 is smaller than the thickness of the portion of the wiring layer directly on the sidewall of the hole 108. The thickness of the portion of the wiring layer directly on the surface 100b of the substrate 100 is greater than the thickness of the portion of the wiring layer directly on the conducting pad 106. In one embodiment, the wiring layer is a stacked structure of a plurality of conducting layers. For example, the portion of the wiring layer directly on the conducting pad 106 is a stacked structure of conducting layers of a first quantity, and the portion of the wiring layer directly on the sidewall of the hole 108 is a stacked structure of conducting layers of a second quantity, wherein the second quantity is higher than the first quantity. As shown in FIG. 1H, the portion of the wiring layer directly on the conducting pad 106 is a stacked structure of two conducting layers (the conducting layers 112c and 112b), and the portion of the wiring layer directly on the sidewall of the hole 108 is a stacked structure of three conducting layers (the conducting layers 112c, 112b, and 112a).

Embodiments of the present invention may have many variations. FIGS. 2A-2G are three-dimensional views showing the steps of forming a chip package according to an embodiment of the present invention, wherein the same or similar reference numbers are used to designate the same or similar elements.

Figure 2A:
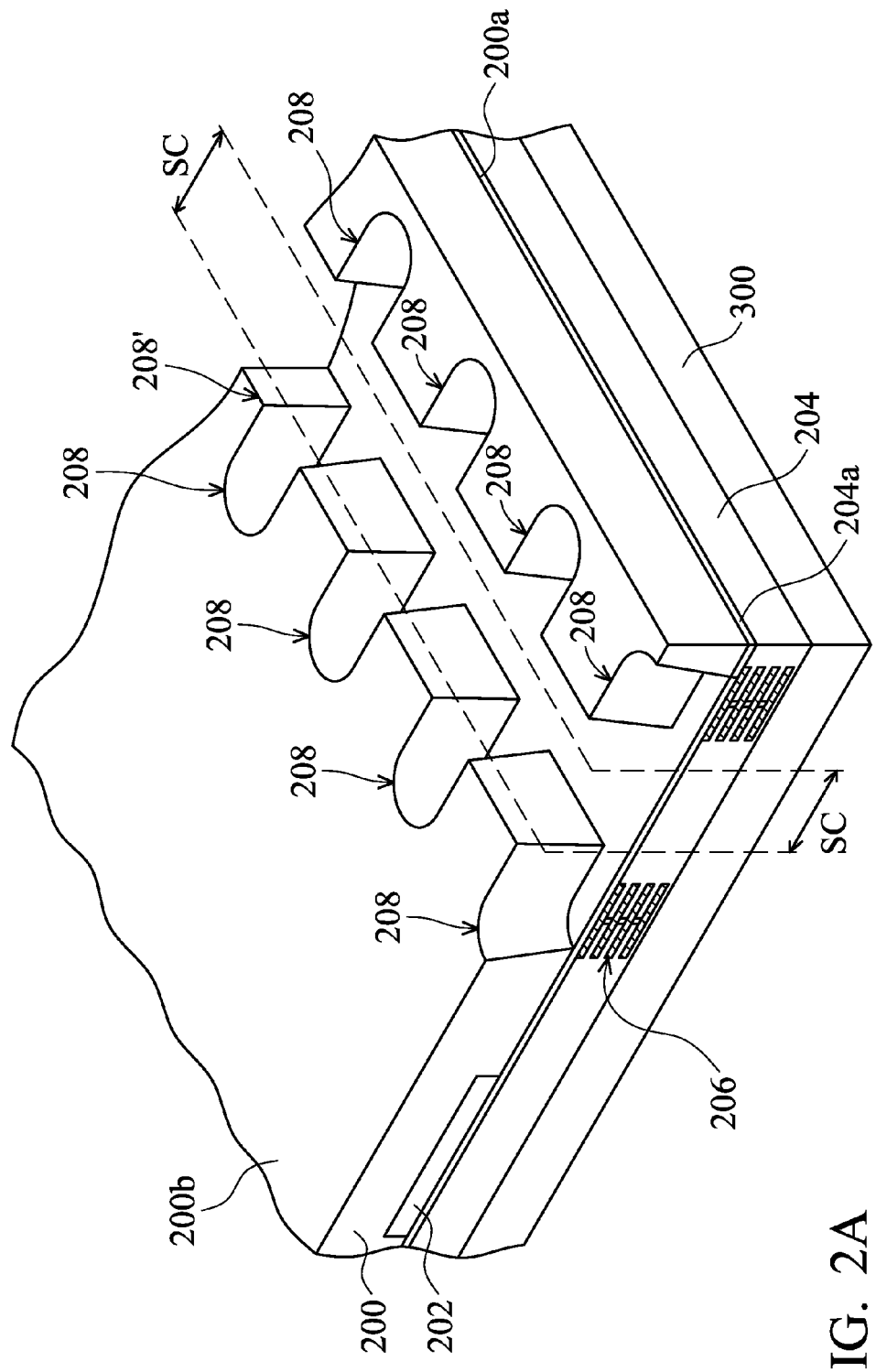
FIGS. 2A-2G are three-dimensional views showing the steps for forming a chip package according to an embodiment of the present invention.

As shown in FIG. 2A, a substrate 200 is provided, which includes a surface 200a and a surface 200b. The substrate 200 is, for example, a semiconductor substrate. In one embodiment, the substrate 200 may be a semiconductor wafer such as a silicon wafer. The substrate 200 may be divided into a plurality of die regions defined by a plurality of predetermined scribe lines SC.

A plurality of device regions 202 may be formed and/or disposed in and/or on the substrate 200. In one embodiment, each of the die regions of the substrate 200 defined by the predetermined scribe lines SC may have at least one device region 202 and a plurality of peripheral regions that correspondingly surround the device regions 202.

As shown in FIG. 2A, dielectric layers 204a and 204 may be formed on the surface 200a of the substrate 200 for the use of insulating and covering. A plurality of conducting pads 206 may be formed between the dielectric layer 204a and the substrate 200. The conducting pads 206 may be disposed on, for example, peripheral regions of the substrate 200 and be arranged along positions near the predetermined scribe lines SC. The conducting pad 206 may be electrically connected to elements in the device region 202 through an interconnection structure (not shown). In one embodiment, each of the conducting pads 206 may include a stacked structure of a plurality of conducting layers formed in the dielectric layer 204. The stacked conducting layers may be electrically connected to each other through, for example, a metal interconnection structure (not shown).

As shown in FIG. 2A, a substrate 300 may be optionally disposed on the surface 200a of the substrate 200. The substrate 300 may, for example, be a glass substrate, quartz substrate, transparent polymer substrate, silicon substrate, ceramic substrate, polymer substrate, or combinations thereof. Then, the substrate 200 may be optionally thinned. For example, the substrate 300 may be used as a support substrate, and a thinning process (such as a mechanical grinding process or a chemical mechanical polishing process) may be performed to the surface 200b of the substrate 200 to thin down the substrate 200 to an appropriate thickness.

Figure 2B:
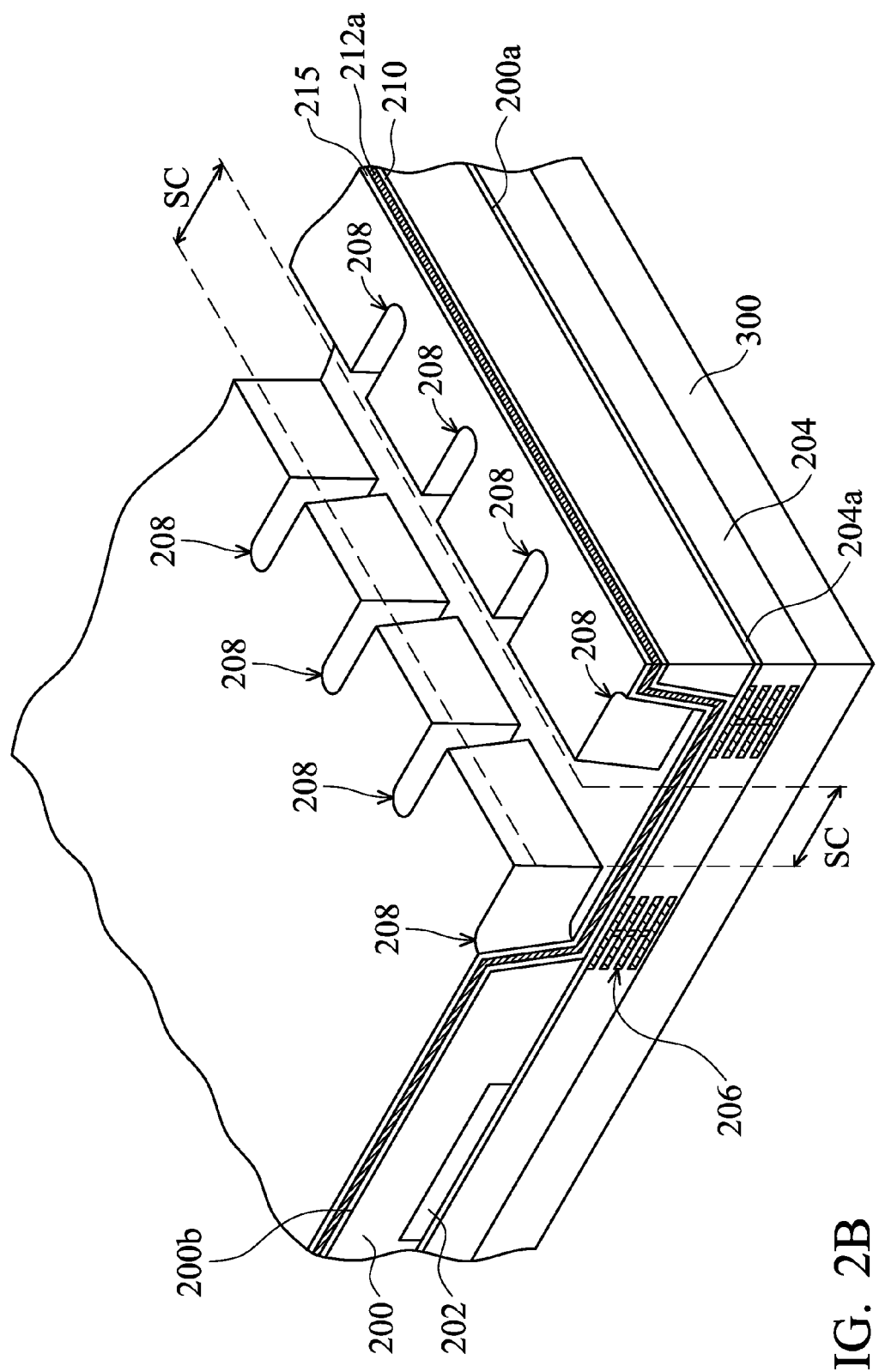

Next, as shown in FIG. 2B, through a photolithography process and an etching process, a portion of the substrate 200 may be removed from the surface 200b of the substrate 200 to form a plurality of holes 208 extending towards the surface 200a. In one embodiment, there may be a corresponding conducting pad 206 at a bottom of each of the holes 208. In one embodiment, a plurality of trenches 208' may be formed in the substrate in the same patterning process, wherein each of the trenches 208' may substantially cover and be parallel to the corresponding predetermined scribe lines SC and connect with the corresponding hole 208. Along with a reduction in the chip size, the size of the conducting pad in the chip shrinks and the distribution density thereof increases. Thus, the width of the hole 208 corresponding to the conducting pad 206 thereunder is accordingly reduced. Thus, the aspect ratio of the hole 208 increases such that the deposition of subsequent material layers is difficult. In one embodiment, because the trenches 208' connect with the plurality of holes 208, the aspect ratio of the entire hole may be significantly reduced such that the deposition process of the subsequent material layers may be successfully performed.

As shown in FIG. 2B, an insulating layer 210 may be formed on the surface 200b of the substrate 200. In one embodiment, the insulating layer 210 may be conformally formed on the surface 200b and extend to the bottom of the hole 208 along the sidewall of the hole 208 to cover the dielectric layer 204a and the conducting pads 206 thereunder. In one embodiment, the material and the formation method of the insulating layer 210 may be (but is not limited to being) similar to those of insulating layer 110 of the embodiment shown in FIG. 1.

Then, a conducting layer 212a may be formed on the insulating layer 210. The material and the formation method of the conducting layer 212a may be (but is not limited to being) similar to those of the conducting layer 112a of the embodiment shown in FIG. 1. In one embodiment, the conducting layer 212a substantially and/or completely covers the insulating layer 210.

Then, the conducting layer 212a may be patterned such that the insulating layer 210 directly on the bottom of the hole 208 is exposed. In one embodiment, a photoresist layer 215 may first be formed on the conducting layer 212a, as shown in FIG. 2B. The photoresist layer 215 may substantially and/or completely cover the conducting layer 212a. In one embodiment, the material and the formation method of the photoresist layer 215 may be (bus is not limited to being) similar to those of the photoresist layer 115 of the embodiment shown in FIG. 1.

Figure 2C:
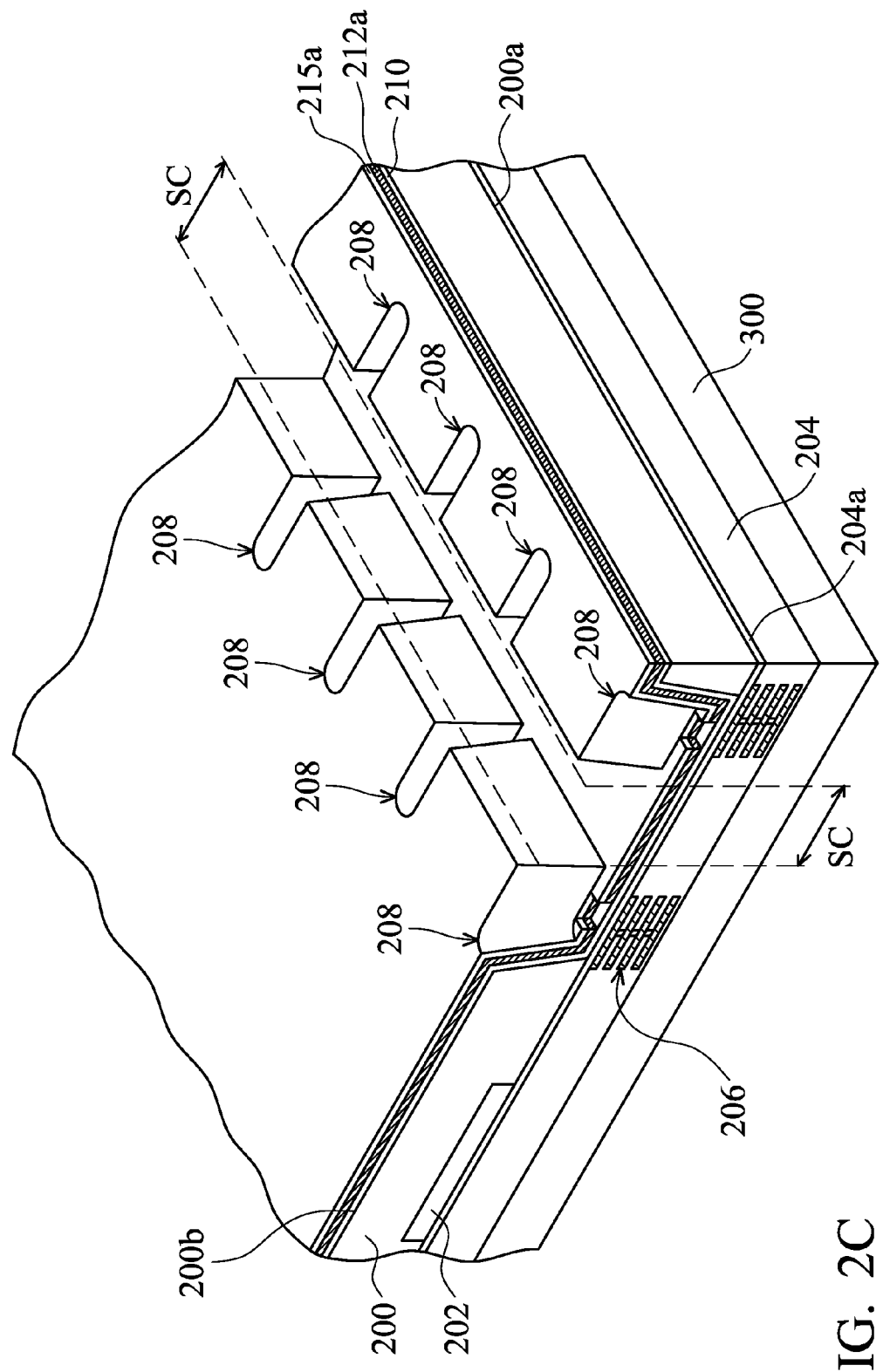

Next, as shown in FIG. 2C, the photoresist layer 215 may be patterned through an exposure process and a development process to form a patterned photoresist layer 215a. The patterned photoresist layer 215a has openings exposing the conducting layer 212a. In addition, the openings of the patterned photoresist layer 215a may align with the conducting pads 206 thereunder. Then, the patterned photoresist layer 215a may be used as a mask, and the exposed conducting layer 212a is etched to expose the insulating layer 210 on the bottoms of the holes 208.

Figure 2D:
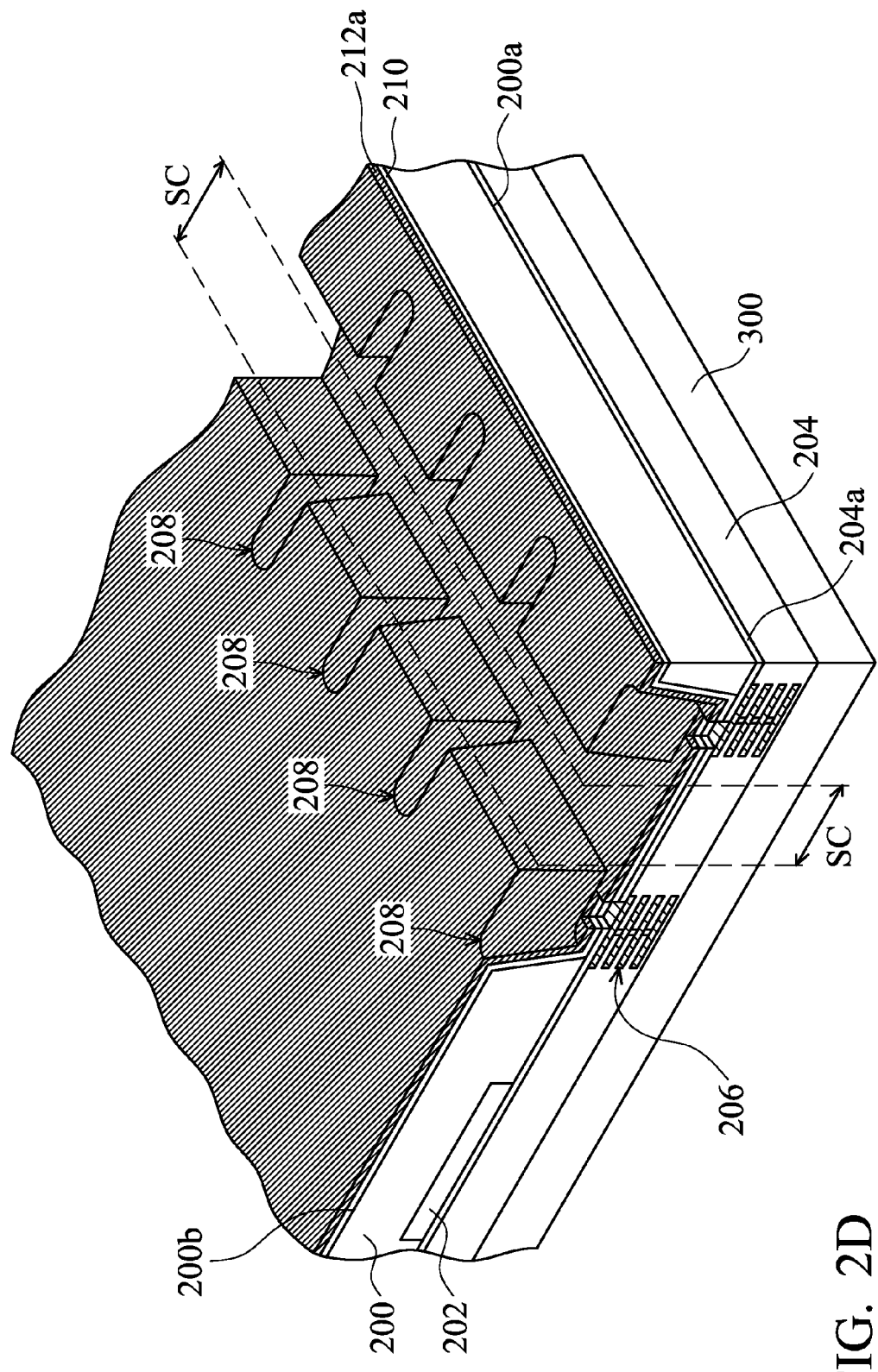

Next, as shown in FIG. 2D, the patterned photoresist layer 215a is removed. The conducting layer 212a may be used as mask, and the exposed insulating layer 210 and the dielectric layer 204 thereunder are etched to expose the conducting pads 206. In one embodiment, the etchant used for etching the insulating layer 210 may not substantially and/or completely etch the conducting layer 212a.

Figure 2E:
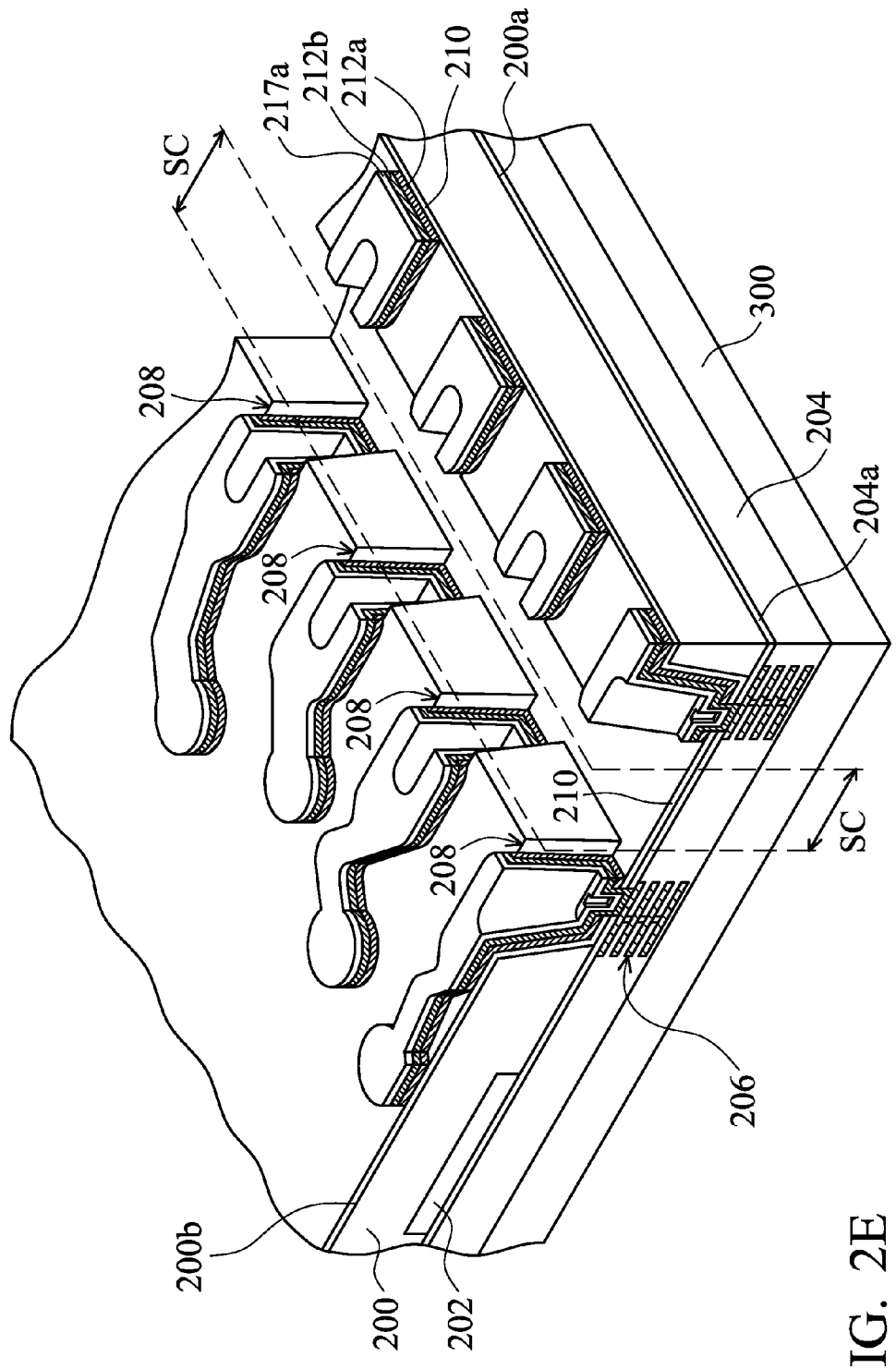

Next, as shown in FIG. 2E, a conducting layer 212b may be conformally formed on the surface 200b of the substrate 200. The conducting layer 212b may extend into the hole 208 and the trench 208' to make electrical contact with the exposed conducting pad 206. The material and the formation method of the conducting layer 212b may be (but is not limited to being) similar to those of the conducting layer 212a. Then, the conducting layer 212b and the conducting layer 212a may be patterned to form the desired conducting patterns according to requirements.

In one embodiment, a patterned photoresist layer 217a may be formed on the conducting layer 212b, which has openings exposing the conducting layer 212b. Then, the patterned photoresist layer 217a may be used as a mask, and the exposed conducting layer 212b and a portion of the conducting layer 212b thereunder are etched to pattern the conducting layer 212b and the conducting layer 212a into the desired conducting pattern according to requirements, as shown in FIG. 2E.

Figure 2F:
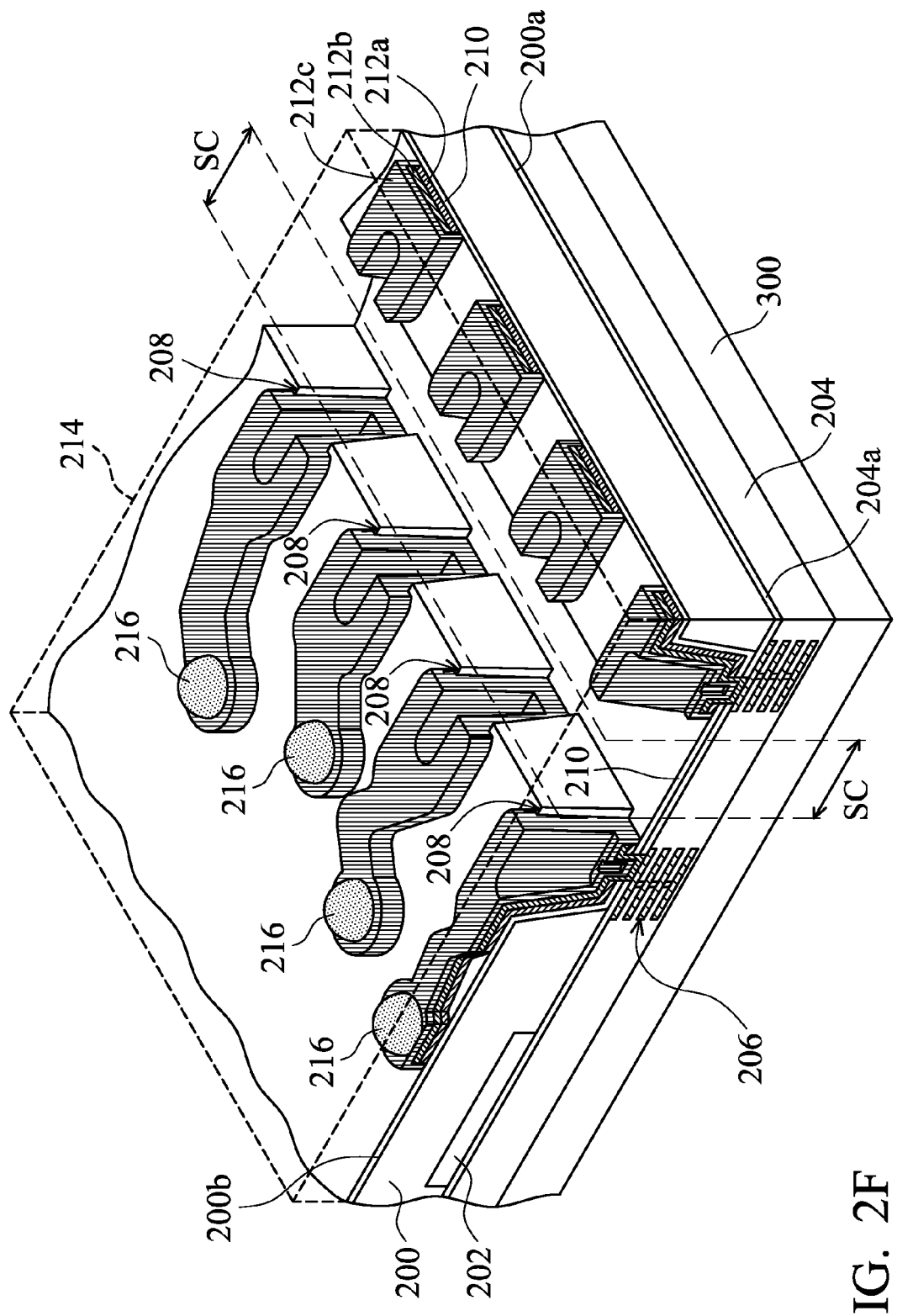

Next, as shown in FIG. 2F, the patterned photoresist layer 217a may be removed. In one embodiment, a conducting layer 212c may optionally be formed on the conducting layer 212b and the conducting layer 212a. In one embodiment, a conducting material may be deposited on the conducting layer 212b and the conducting layer 212a which are patterned by using an electroplating process or an electroless plating process to form the conducting layer 212c. The conducting layer 212c has a conducting pattern substantially the same as that of the conducting layer 212b. The conducting layer 212a, the conducting layer 212b, and the conducting layer 212c may together serve as a wiring layer electrically connected to the device region 202. In one embodiment, the conducting layer 212c covers a side terminal of the conducting layer 212a and a side terminal of the conducting layer 212b. In one embodiment, the side terminal of the conducting layer 212a is substantially coplanar with the side terminal of the conducting layer 212b. In one embodiment, the material of the conducting layer 212c is different from that of the conducting layer 212a or the conducting layer 212b. The thickness of the conducting layer 212c may, for example, be greater than that of the conducting layer 212a or the conducting layer 212b.

Next, a patterned protection layer 214 may be optionally formed on the surface 200b of the substrate 200 and the wiring layer, which has openings exposing the wiring layer. Then, conducting bumps 216 may be formed in the openings of the protection layer 214. The conducting bump 216 is electrically connected to the device region 202 through the wiring layer and the conducting pad 206. In one embodiment, the protection layer 214 may cover the predetermined scribe lines SC. In another embodiment, the protection layer 214 may not cover the predetermined scribe lines SC.

Figure 2G:
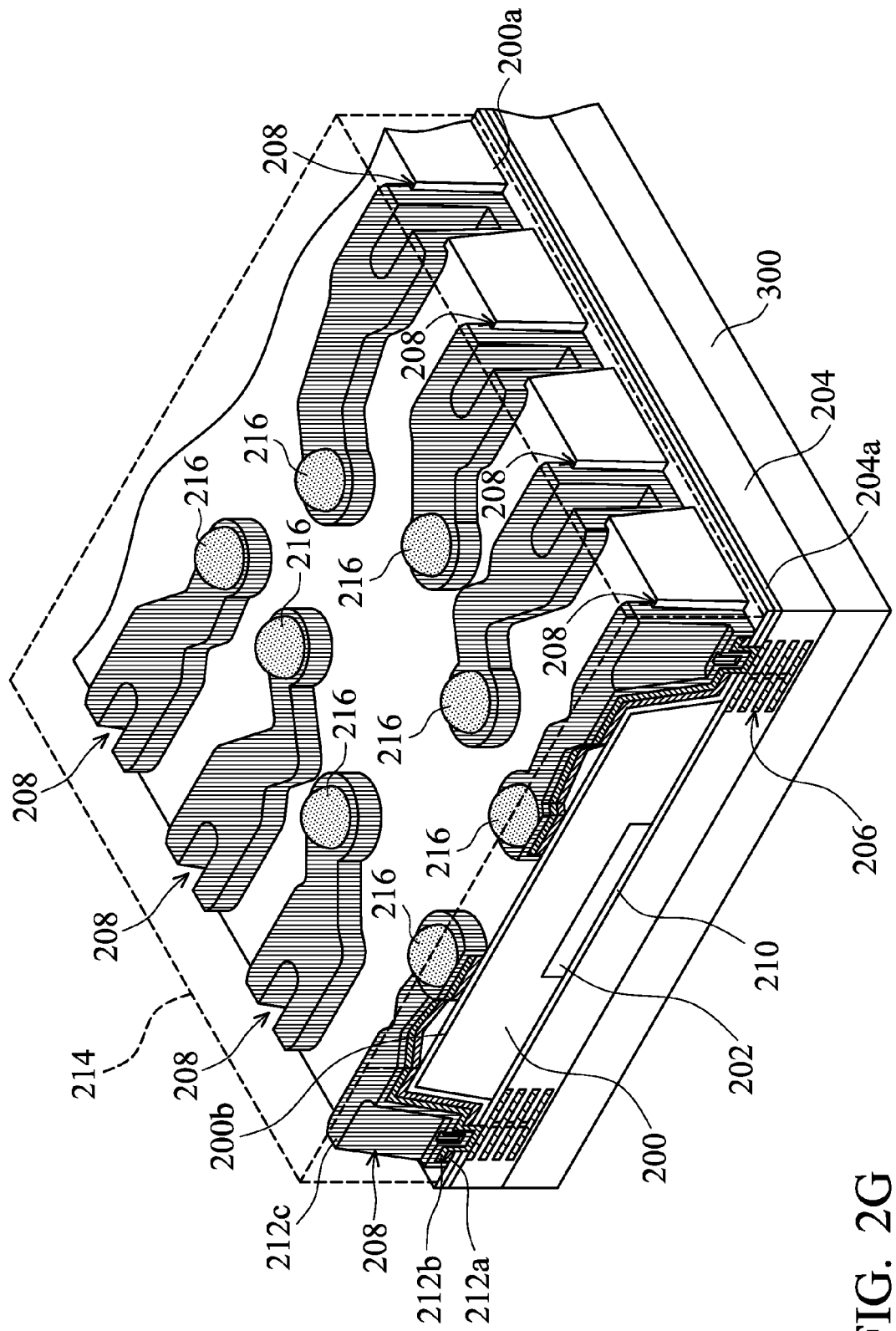

Next, as shown in FIG. 2G, a dicing process is performed along the predetermined scribe lines SC of the substrate 200 to form at least one chip package. In one embodiment, the thickness of the portion of the wiring layer directly on conducting pad 206 is smaller than the thickness of the portion of the wiring layer directly on the sidewall of the hole 208. The thickness of the portion of the wiring layer directly on the surface 200b of the substrate 200 is greater than the thickness of the portion of the wiring layer directly on the conducting pad 206. In one embodiment, the wiring layer is a stacked structure of a plurality of conducting layers. For example, the portion of the wiring layer directly on the conducting pad 206 is a stacked structure of conducting layers of a first quantity, and the portion of the wiring layer directly on the sidewall of the hole 208 is a stacked structure of conducting layers of a second quantity, wherein the second quantity is higher than the first quantity. As shown in FIG. 2G, the portion of the wiring layer directly on the conducting pad 206 is a stacked structure of two conducting layers (the conducting layers 212c and 212b), and the portion of the wiring layer directly on the sidewall of the hole 208 is a stacked structure of three conducting layers (the conducting layers 212c, 212b, and 212a).

Embodiments of the present invention may have many variations. FIGS. 3A-3H are cross-sectional views showing the steps for forming a chip package according to an embodiment of the present invention, wherein the same or similar reference numbers are used to designate the same or similar elements.

Figure 3A:
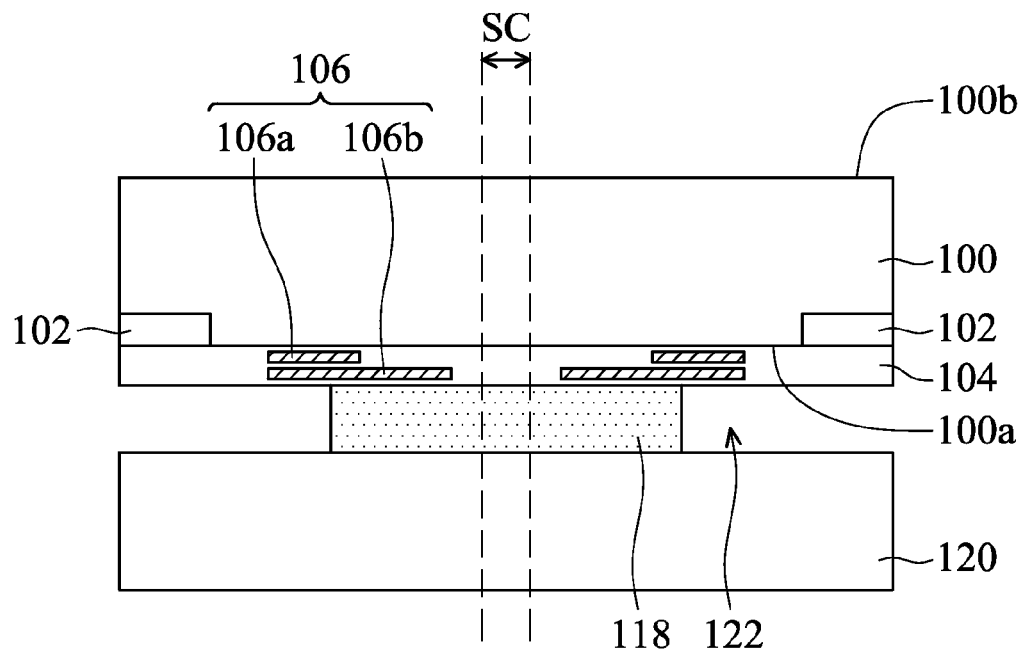
FIGS. 3A-3H are cross-sectional views showing the steps for forming a chip package according to an embodiment of the present invention.

As shown in FIG. 3A, in the front-end chip step, a substrate 100 is first provided, which includes a surface 100a and a surface 100b. The substrate 100 is, for example, a semiconductor substrate. In one embodiment, the substrate 100 may be a semiconductor wafer such as a silicon wafer. The substrate 100 may be divided into a plurality of die regions defined by a plurality of predetermined scribe lines SC. A plurality of device regions 102 may be formed or disposed in the substrate 100.

As shown in FIG. 3A, at least a dielectric layer 104 may be formed on the surface 100a of the substrate 100 for the use of insulating and covering. A plurality of conducting pads 106 may be formed between the dielectric layer 104 and the substrate 100. The conducting pads 106 may be disposed on, for example, peripheral regions of the substrate 100 and be arranged along positions near the predetermined scribe lines SC. The conducting pad 106 may be electrically connected to elements in the device region 102 through an interconnection structure (not shown). In one embodiment, each of the conducting pads 106 may include a stacked structure of a plurality of conducting layers formed in the dielectric layer 104. The stacked conducting layers may be electrically connected to each other through, for example, a metal interconnection structure (not shown).

In the embodiment shown in FIG. 3A, the conducting pad 106 may include multiple conducting pads which may include a conducting pad 106a and a conducting pad 106b. In one embodiment, the thickness of the conducting pad 106b may be greater than the thickness of the conducting pad 106a. In this case, the conducting pad 106a with the greater thickness may be chosen to make electrical contact with a wiring layer which will be subsequently formed. In one embodiment, the conducting pad 106b is closer to the predetermined scribe line SC, compared with the conducting pad 106a.

After the front-end chip process step is accomplished, a back-end packaging process step may then be performed to the wafer with the integrated circuits formed therein. As shown in FIG. 3A, a spacer layer 118 and a cover plate 120 may be optionally disposed on the surface 100a of the substrate 100. The spacer layer 118, the cover plate 120, and the substrate 100 may define a substantially closed cavity 122 on the device region 102. The cavity 122 may, for example, be used to contain microlenses, filter plate structures, or other optical structures.

Then, the substrate 100 may optionally be thinned. For example, the cover plate 120 may be used as a support substrate, and a thinning process (such as a mechanical grinding process or a chemical mechanical polishing process) may be performed to the surface 100b of the substrate 100 to thin down the substrate 100 to an appropriate thickness.

Figure 3B:
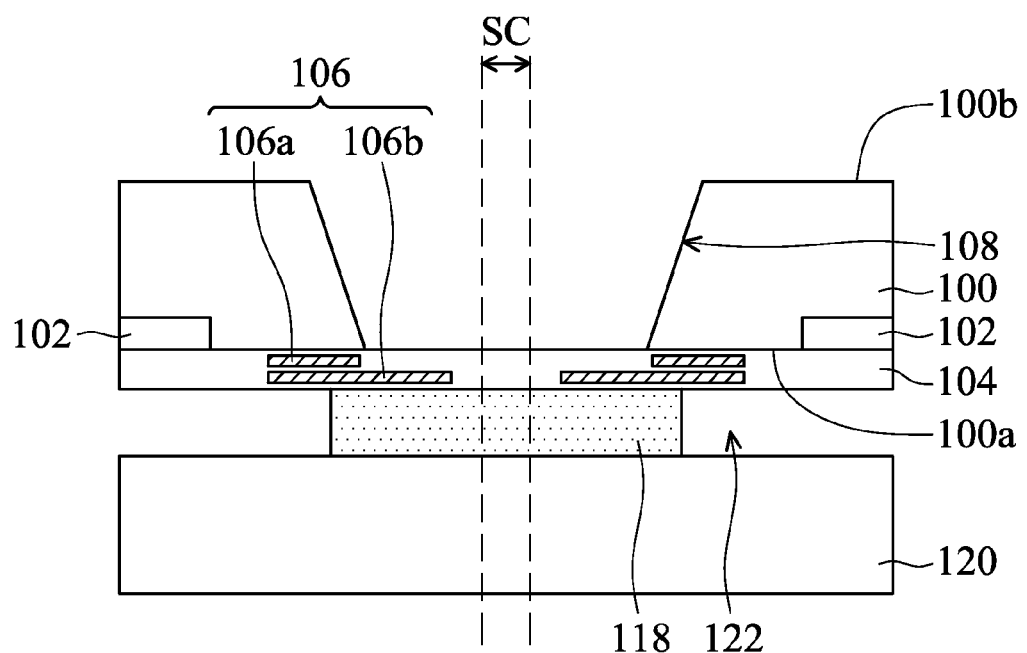

Next, as shown in FIG. 3B, through a photolithography process and an etching process, a portion of the substrate 100 may be removed from the surface 100b of the substrate 100 to form a plurality of holes 108 extending towards the surface 100a. In one embodiment, the holes 108 may include trenches which may be substantially parallel to the predetermined scribe lines, and may, for example, be similar to the hole constructed by the holes 208 and the trenches 208' shown in FIG. 2A.

Figure 4A:
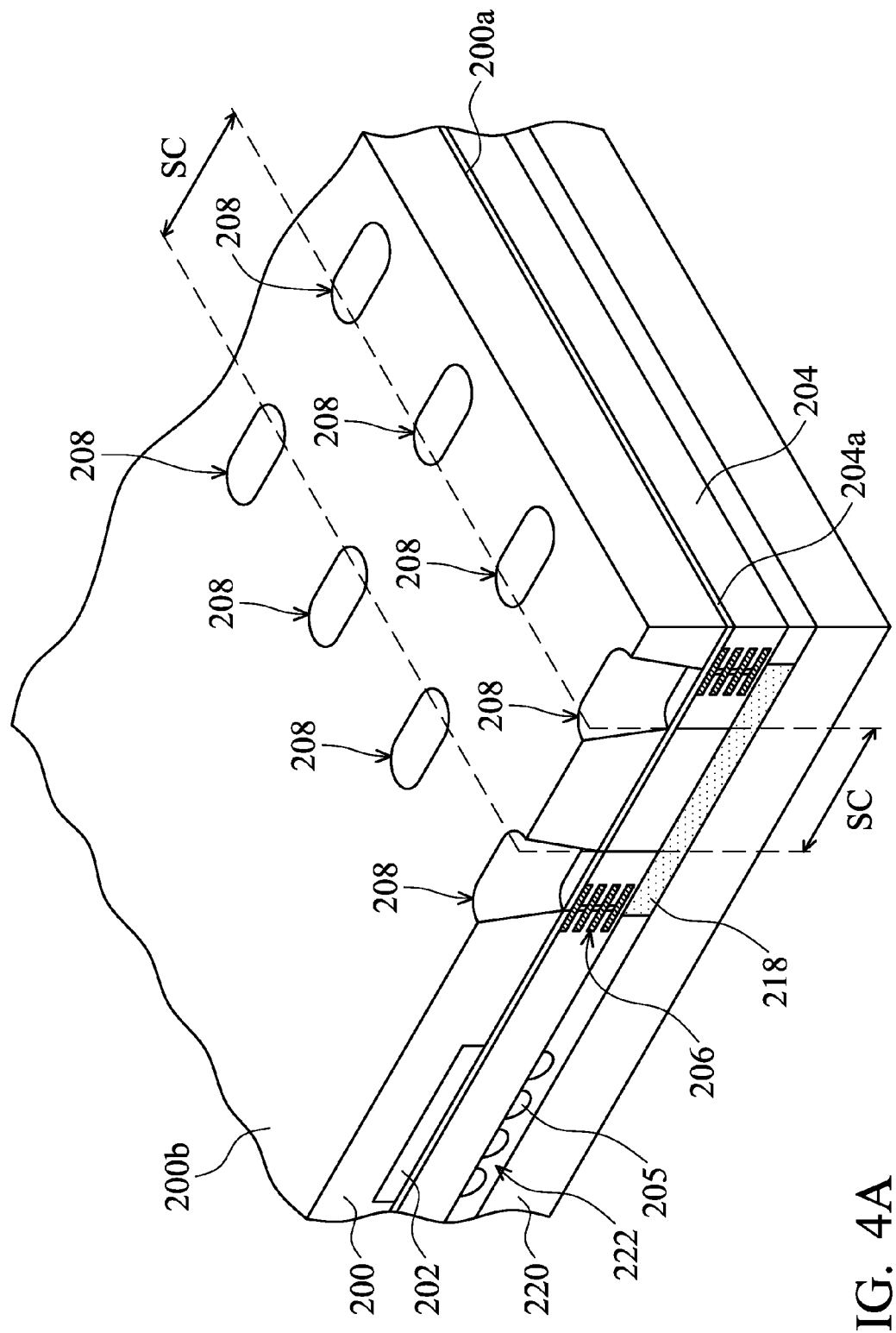
FIGS. 4A and 4B are three-dimensional views respectively showing semifinished products of chip packages according to embodiments of the present invention.
Figure 4B:
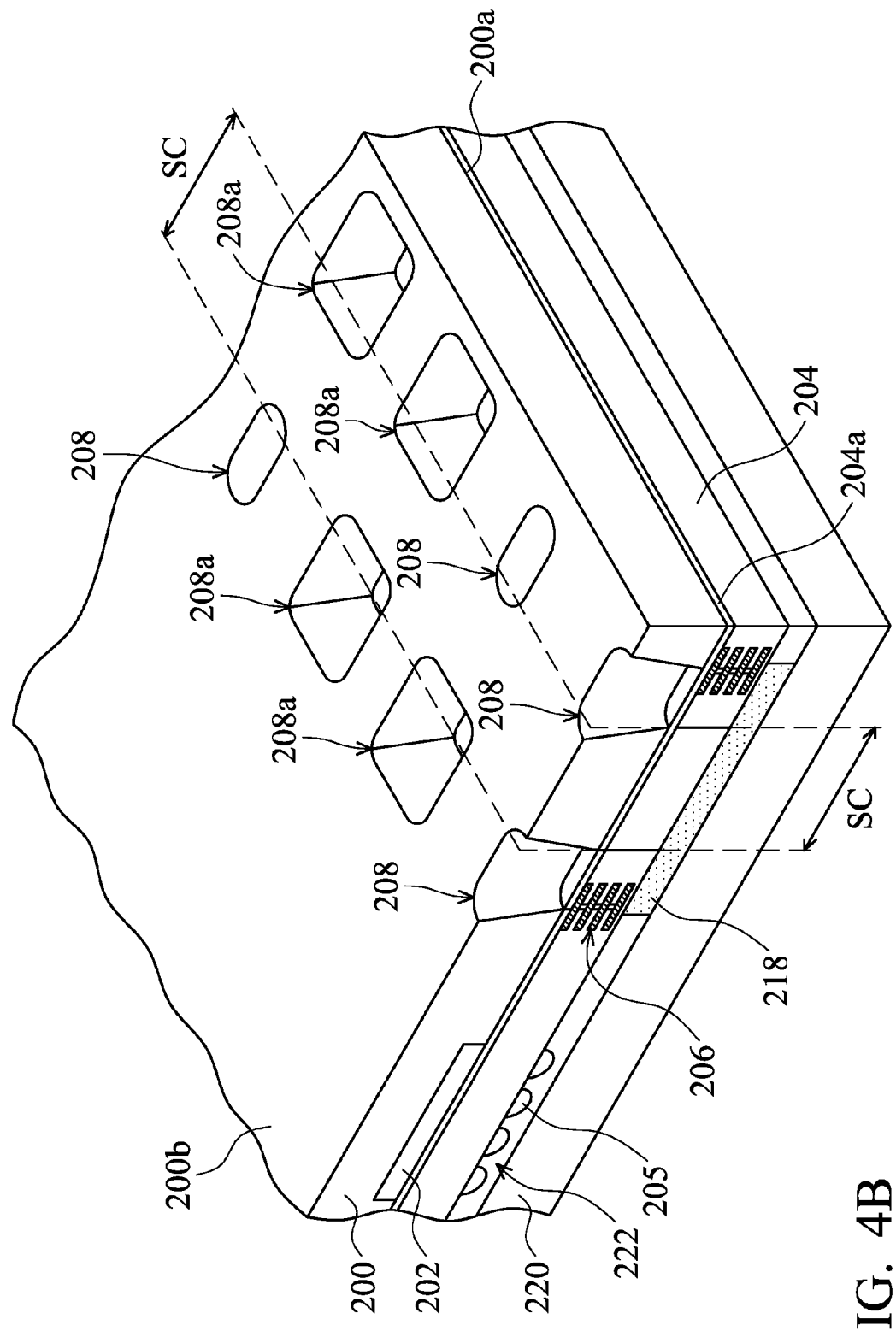

However, it should be appreciated that embodiments of the invention are not limited thereto. FIGS. 4A and 4B are three-dimensional views respectively showing semifinished products of chip packages according to embodiments of the present invention which are similar to the structure shown in FIG. 2B. As shown in FIG. 4A, in one embodiment, the shape and the distribution of the hole 108 shown in FIG. 3B may be similar to those of the hole 208 shown in FIG. 4A, which may be located on the corresponding conducting pad, extend towards the predetermined scribe line SC, and may, for example, extend into the predetermined scribe line SC. As shown in FIG. 4B, in another embodiment, the shape and the distribution of the hole 108 shown in FIG. 3B may be similar to those of the hole 208 and the hole 208a shown in FIG. 4B, wherein the hole 208a may have a greater width so as to cover a plurality of conducting pads. In this case, a plurality of wiring layers which will be subsequently formed may extend into the same hole 208a to make electrical contact with the different conducting pads exposed by the hole 208a.

Figure 3C:
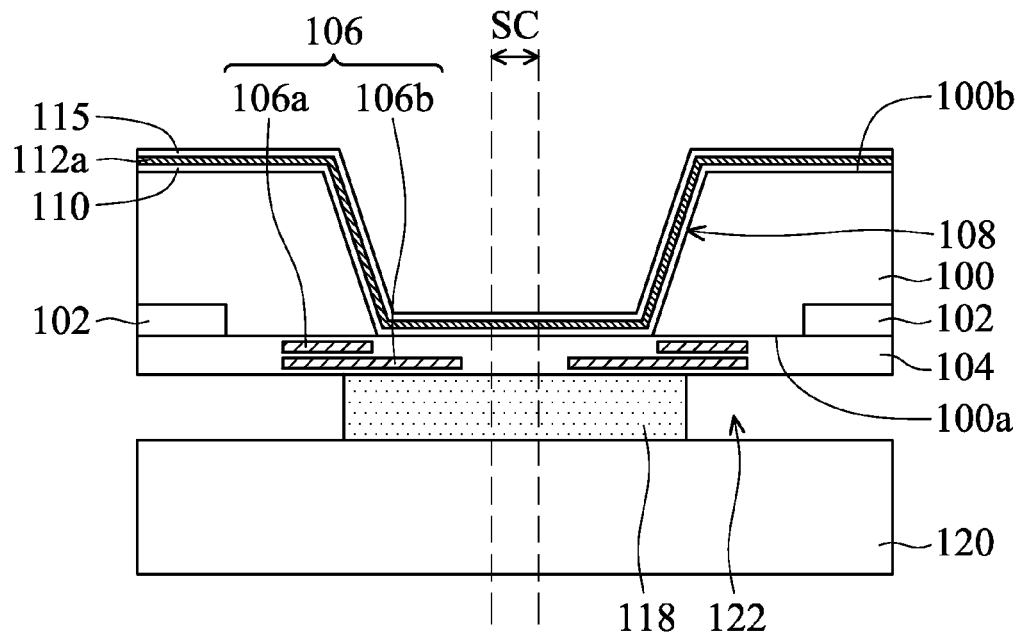

Next, as shown in FIG. 3C, an insulating layer 110 may be formed on the surface 100b of the substrate 100. In one embodiment, the insulating layer 110 may be conformally formed on the surface 100b and extend towards the bottom of the hole 108 along the sidewall of the hole 108 to cover the dielectric layer 104 and the conducting pads 106 thereunder. In one embodiment, the insulating layer 110 may include silicon oxide, silicon nitride, silicon oxynitride, or combinations thereof. For example, the insulating layer 110 may be formed by using a chemical vapor deposition process or another suitable process. In another embodiment, the insulating layer 110 with a polymer material may be formed by using an applying process, spin coating process, or spray coating process.

Then, a wiring layer may be formed on the insulating layer 110. For example, in one embodiment, a conducting layer 112a may be formed on the insulating layer 110. The conducting layer 112a may include aluminum, copper, an alloy of aluminum and copper, or combinations thereof. The formation method for the conducting layer 112a may include a physical vapor deposition process, chemical vapor deposition process, applying process, or combinations thereof. In one embodiment, the conducting layer 112a is formed on the insulating layer 110 by using a sputtering process. In one embodiment, the conducting layer 112a substantially and/or completely covers the insulating layer 110.

Then, the conducting layer 112a is patterned such that the insulating layer 110 directly on the bottom of the hole 108 is exposed. In one embodiment, a photoresist layer 115 may first be formed on the conducting layer 112a, as shown in FIG. 3C. The photoresist layer 115 may substantially and/or completely cover the conducting layer 112a. In one embodiment, the photoresist layer 115 may be an electroplated photoresist which may be deposited on the surface of the conducting layer 112a by using an electroplating process to conformally, substantially, and/or completely cover the conducting layer 112a.

Figure 3D:
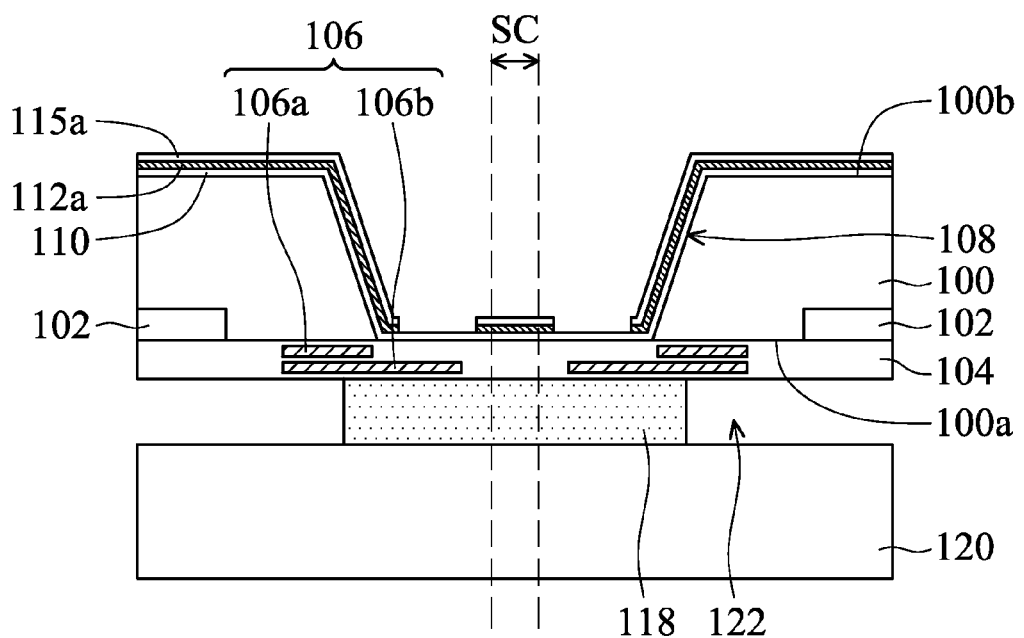

Next, as shown in FIG. 3D, the photoresist layer 115 may be patterned through an exposure process and a development process to form a patterned photoresist layer 115a. The patterned photoresist layer 115a has openings exposing the conducting layer 112a, wherein a side terminal of the conducting pad 106b which is closest to the predetermined scribe line may be located below the opening of the patterned photoresist layer 115a. Then, the patterned photoresist layer 115a may be used as a mask, and the exposed conducting layer 112a is etched to expose the insulating layer 110 on the bottoms of the holes 108.

Figure 3E:
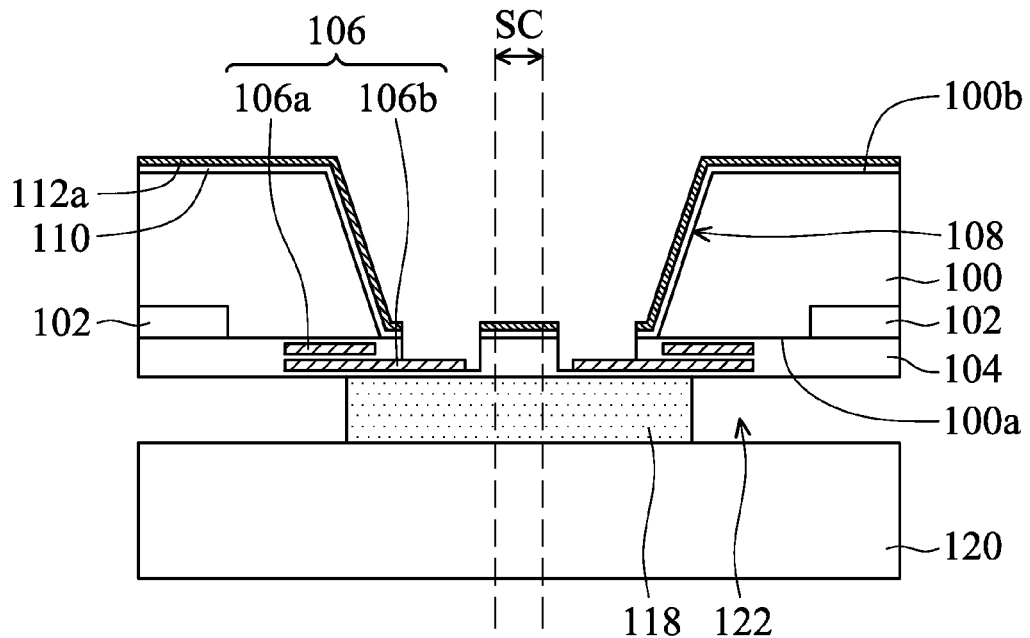

Next, as shown in FIG. 3E, the patterned photoresist layer 115a is removed. The conducting layer 112a may be used as mask, and the exposed insulating layer 110 and the dielectric layer 104 thereunder are etched to expose the conducting pads 106. In one embodiment, the etchant used for etching the insulating layer 110 may not substantially and/or completely etch the conducting layer 112a. In one embodiment, the conducting pad 106a is covered by the dielectric layer 104 without being exposed. In one embodiment, a portion of the top surface and the side surface of the conducting pad 106b are exposed.

Figure 3F:
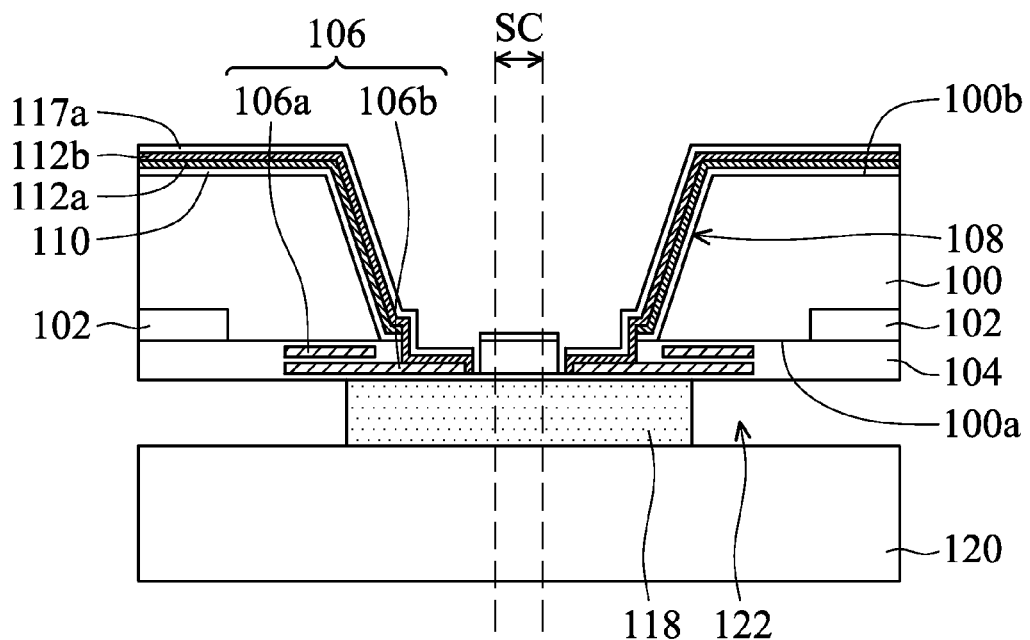

Next, as shown in FIG. 3F, a conducting layer 112b may be conformally formed on the surface 100b of the substrate 100. The conducting layer 112b may extend into the hole 108 to make electrical contact with the exposed conducting pad 106b. In one embodiment, the conducting layer 112b may directly contact the portion of the top surface and the side surface of the conducting pad 106b. The material and the formation method of the conducting layer 112b may be similar to those of the conducting layer 112a. Then, the conducting layer 112b and the conducting layer 112a may be patterned to form the desired conducting patterns according to requirements.

In one embodiment, a patterned photoresist layer 117a may be formed on the conducting layer 112b, which has openings exposing a portion of the conducting layer 112b. Then, the patterned photoresist layer 117a may be used as a mask, and the exposed conducting layer 112b and a portion of the conducting layer 112b thereunder are etched to pattern the conducting layer 112b and the conducting layer 112a into the desired conducting pattern according to requirements, as shown in FIG. 3F.

Figure 3G:
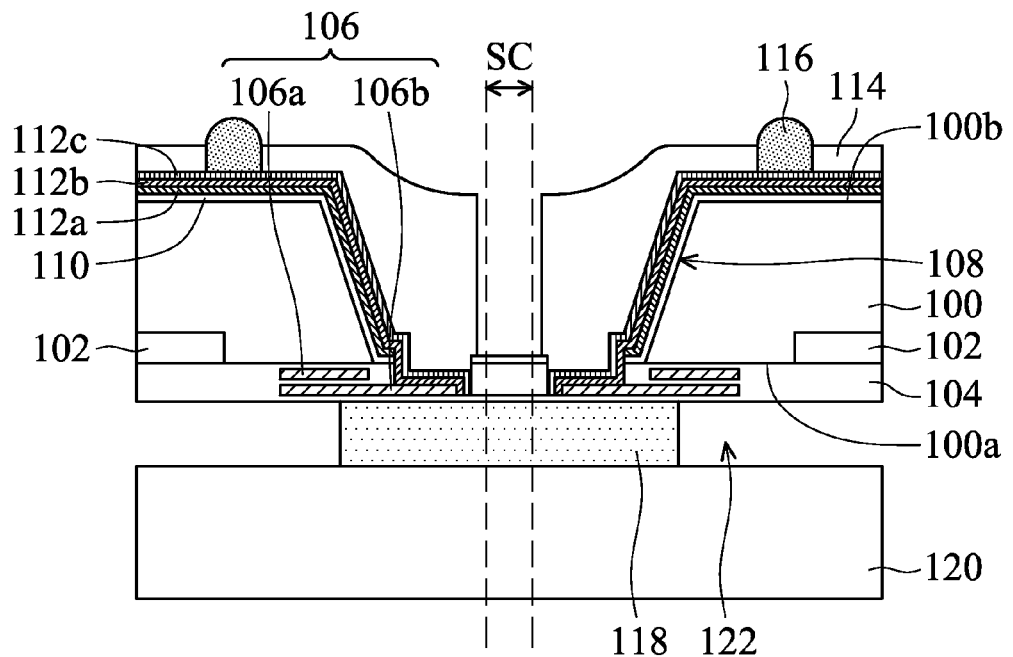

Next, as shown in FIG. 3G, the patterned photoresist layer 117a may be removed. In one embodiment, a conducting layer 112c may be optionally formed on the conducting layer 112b and the conducting layer 112a. In one embodiment, a conducting material may be deposited on the conducting layer 112b and the conducting layer 112a which are patterned by using an electroplating process or an electroless plating process to form the conducting layer 112c. The conducting layer 112c has a conducting pattern substantially the same as that of the conducting layer 112b. The conducting layer 112a, the conducting layer 112b, and the conducting layer 112c may together serve as a wiring layer electrically connected to the device region 102. In one embodiment, the conducting layer 112c covers a side terminal (also called side surface) of the conducting layer 112a and a side terminal (also called side surface) of the conducting layer 112b. In one embodiment, the side terminal of the conducting layer 112a is substantially coplanar with the side terminal of the conducting layer 112b. In one embodiment, the material of the conducting layer 112c is different from that of the conducting layer 112a or the conducting layer 112b. The thickness of the conducting layer 112c may, for example, be greater than that of the conducting layer 112a or the conducting layer 112b.

Next, a patterned protection layer 114 may optionally be formed on the surface 100b of the substrate 100 and the wiring layer, which has openings exposing the wiring layer. Then, conducting bumps 116 may be formed in the openings of the protection layer 114. The conducting bump 116 is electrically connected to the device region 102 through the wiring layer and the conducting pad 106. In one embodiment, the protection layer 114 may not cover the predetermined scribe lines SC to prevent damage to the package caused by a subsequent dicing process.

Figure 3H:
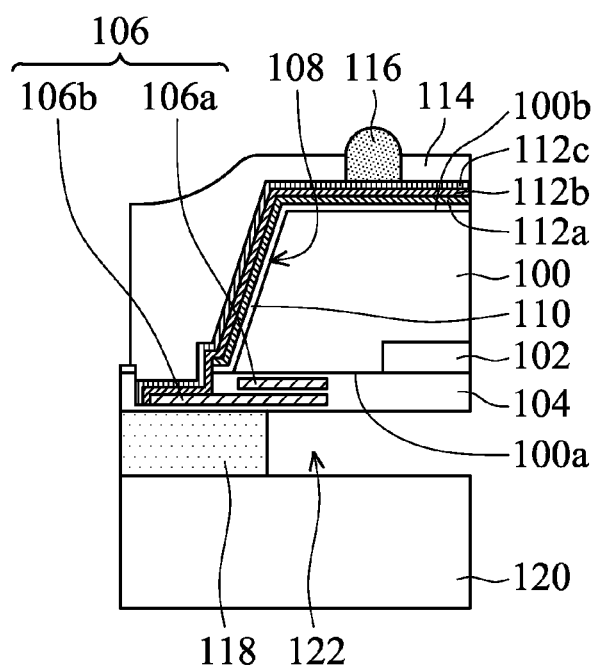

Next, as shown in FIG. 3H, a dicing process is performed along the predetermined scribe lines SC of the substrate 100 to form at least one chip package. In one embodiment, the thickness of the portion of the wiring layer directly on conducting pad 106 is less than the thickness of the portion of the wiring layer directly on the sidewall of the hole 108. The thickness of the portion of the wiring layer directly on the surface 100b of the substrate 100 is greater than the thickness of the portion of the wiring layer directly on the conducting pad 106. In one embodiment, the wiring layer is a stacked structure of a plurality of conducting layers. For example, the portion of the wiring layer directly on the conducting pad 106 is a stacked structure of conducting layers of a first quantity, and the portion of the wiring layer directly on the sidewall of the hole 108 is a stacked structure of conducting layers of a second quantity, wherein the second quantity is larger than the first quantity. As shown in FIG. 3H, the portion of the wiring layer directly on the conducting pad 106 is a stacked structure of two conducting layers (the conducting layers 112c and 112b), and the portion of the wiring layer directly on the sidewall of the hole 108 is a stacked structure of three conducting layers (the conducting layers 112c, 112b, and 112a). In one embodiment, because the wiring layer is in direct contact with the top surface and the side terminal (also called side surface) of the conducting pad 106b (also called middle conducting pad) with a greater thickness, the bonding between the wiring layer and the conducting pad is more reliable, improving the quality of the chip package.

In the embodiments of the invention, the desired patterned material layers may be successfully formed in the hole having a high aspect ratio, improving the quality of the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface and a second surface;
   a device region disposed in or on the substrate;
   a conducting pad disposed in the substrate or on the first surface, wherein the conducting pad is electrically connected to the device region;
   a hole extending from the second surface towards the first surface of the substrate;
   a wiring layer disposed on the second surface of the substrate and extending towards the first surface of the substrate along a sidewall of the hole to make electrical contact with the conducting pad, wherein a thickness of a first portion of the wiring layer located directly on the conducting pad is smaller than a thickness of a second portion of the wiring layer located within the hole and directly on the sidewall of the hole; and an insulating layer disposed between the substrate and the wiring layer.

2. The chip package as claimed in claim 1, wherein a thickness of a third portion of the wiring layer located directly on the second surface of the substrate is greater than the thickness of the first portion of the wiring layer.

3. The chip package as claimed in claim 1, wherein the wiring layer is a stacked structure consisting of a plurality of conducting layers.

4. The chip package as claimed in claim 3, wherein the first portion of the wiring layer is a stacked structure of conducting layers of a first quantity, the second portion of the wiring layer is a stacked structure of conducting layers of a second quantity, and the second quantity is higher than the first quantity.

5. The chip package as claimed in claim 3, wherein the second portion of the wiring layer comprises a first conducting layer, a second conducting layer, and a third conducting layer, and the first portion of the wiring layer comprises the second conducting layer and the third conducting layer.

6. The chip package as claimed in claim 5, wherein the third conducting layer covers a side terminal of the first conducting layer and a side terminal of the second conducting layer.

7. The chip package as claimed in claim 6, wherein the side terminal of the first conducting layer is substantially coplanar with the side terminal of the second conducting layer.

8. The chip package as claimed in claim 5, wherein the material of the first conducting layer is different from the material of the third conducting layer.

9. The chip package as claimed in claim 5, wherein a thickness of the third conducting layer is greater than a thickness of the first conducting layer or a thickness of the second conducting layer.

10. The chip package as claimed in claim 1, further comprising:
a protection layer disposed on the second surface of the substrate, wherein the protection layer has an opening exposing the wiring layer; and
a conducting bump filling the opening of the protection layer to make electrical connection to the wiring layer.

11. The chip package as claimed in claim 1, wherein the hole extends from a third surface towards an inner portion of the substrate.

12. The chip package as claimed in claim 1, further comprising a second conducting pad stacked on the conducting pad, wherein the conducting pad and the second conducting pad are electrically connected to the device region, and the conducting pad is disposed between the second conducting pad and the substrate.

13. The chip package as claimed in claim 12, wherein a thickness of the second conducting pad is greater than a thickness of the conducting pad.

14. The chip package as claimed in claim 12, wherein the wiring layer is in direct contact with the second conducting pad.

15. The chip package as claimed in claim 12, wherein the wiring layer is not in direct contact with the conducting pad.

16. The chip package as claimed in claim 1, wherein the wiring layer is in direct contact with a top surface and a side surface of the conducting pad.

17. The chip package as claimed in claim 1, further comprising:
a plurality of second conducting pads disposed in the substrate or on the first surface, wherein the second conducting pads are electrically connected to the device region, and the hole is disposed above at least two of the conducting pad and the second conducting pads; and
a plurality of second wiring layers disposed on the second surface of the substrate and extending towards the first surface of the substrate along the sidewall of the hole to make electrical contact with at least two of the conducting pads, respectively, wherein the insulating layer is disposed between the substrate and the second wiring layers.

18. A method for forming a chip package, comprising:
providing a substrate having a first surface and a second surface, wherein a device region and a conducting pad are formed in the substrate or disposed on the substrate, and the conducting pad is electrically connected to the device region;
removing a portion of the substrate from the second surface of the substrate to form at least one hole extending towards the first surface, wherein the hole overlaps a portion of the conducting pad;
conformally forming an insulating layer on the second surface of the substrate, wherein the insulating layer extends to a bottom of the hole to cover the conducting pad;
forming a first conducting layer on the insulating layer;
removing a portion of the first conducting layer to expose the insulating layer on the bottom of the hole;
using the first conducting layer as a mask and etching the exposed insulating layer to expose the conducting pad;
forming a second conducting layer on the second surface of the substrate, wherein the second conducting layer extends into the hole to make electrical contact with the conducting pad;
patterning the first conducting layer and the second conducting layer; and
forming a third conducting layer on the patterned second conducting layer.

19. The method for forming a chip package as claimed in claim 18, wherein the step of removing the portion of the first conducting layer to expose the insulating layer on the bottom of the hole comprises:
forming a patterned electroplated photoresist layer on the first conducting layer, wherein the patterned electroplated photoresist layer has an opening exposing the first conducting layer;
using the patterned electroplated photoresist layer as a mask and etching the exposed first conducting layer to expose the insulating layer on the bottom of the hole; and
removing the patterned electroplated photoresist layer.

20. The method for forming a chip package as claimed in claim 18, wherein the step of patterning the first conducting layer and the second conducting layer comprises:
forming a second patterned photoresist layer on the second conducting layer, wherein the second patterned photoresist layer has at least one opening exposing the second conducting layer;
using the second patterned photoresist layer as a mask and etching the exposed second conducting layer and a portion of the first conducting layer to pattern the first conducting layer and the second conducting layer; and
removing the second patterned photoresist layer.

21. The method for forming a chip package as claimed in claim 18, wherein the step of forming the third conducting layer comprises depositing a conducting material on the patterned second conducting layer by using an electroplating process to form the third conducting layer.

22. The method for forming a chip package as claimed in claim 21, further comprising performing a dicing process along at least one predetermined scribe line of the substrate to form at least one chip package.

23. The method for forming a chip package as claimed in claim 18, wherein the hole comprises a trench substantially parallel to the predetermined scribe line.

24. The method for forming a chip package as claimed in claim 18, wherein the insulating layer is formed by using a chemical vapor deposition process.

\* \* \* \* \*